United States Patent [19]

Kondo et al.

[11] Patent Number: 4,586,978
[45] Date of Patent: May 6, 1986

[54] PROOFING APPARATUS

[75] Inventors: Shuzi Kondo, Kyoto; Iwao Hirose; Masayoshi Wakabayashi, both of Shiga, all of Japan

[73] Assignee: Dainippon Screen Seizo Kabushiki Kaisha, Japan

[21] Appl. No.: 640,342

[22] Filed: Aug. 13, 1984

[30] Foreign Application Priority Data

Feb. 16, 1984 [JP] Japan .................................. 59-26122

[51] Int. Cl.⁴ ............................................ G03B 27/02
[52] U.S. Cl. ................................. 156/540; 156/230;
156/358; 156/555; 156/574; 156/583.1;
354/301; 355/78
[58] Field of Search ............... 156/230, 238, 540, 555,
156/583.1, 582, 523, 574, 382, 359;
354/301–303; 355/78, 88, 97

[56] References Cited

U.S. PATENT DOCUMENTS

| | | | |
|---|---|---|---|
| 3,195,435 | 7/1965 | Stievenart | 354/301 |
| 3,650,625 | 3/1972 | Hoyte | 156/230 X |
| 3,685,420 | 8/1972 | Stievenart | 354/301 X |
| 4,147,428 | 4/1979 | Nishikawa | 355/88 |
| 4,358,195 | 11/1982 | Kuehule | 355/88 X |

Primary Examiner—David Simmons
Attorney, Agent, or Firm—Ostrolenk, Faber, Gerb & Soffen

[57] ABSTRACT

A simple proofing apparatus which provides a proof by preparing a synthetic image from proofreading films of each color which are colored with cyan, yellow, magenta, black etc., corresponding to original plates for each color separation films, comprising a table for mounting a ground paper or a proofreading film thereon, a positioning pin adapted to engage with a punch hole formed through said proofreading film for positioning said ground paper or said proofreading film on said table, an absorbing groove provided on an upper surface of said table for fixedly adsorbing said ground paper or said proofreading film on said table, and a heating means adapted to heat said proofreading film mounted on said table and move on said table.

10 Claims, 8 Drawing Figures

PROOFING APPARATUS

BACKGROUND OF THE INVENTION

This invention relates to a device for producing a proof by creating a synthetic image from proofing films of various colors.

Conventionally, there have been proposed various proofreading processes which may provide an image approximately that of a final print without the need for printing a proof with an engraved printing plate and ink. For example, known transfer systems make use of photosensitive materials to carry out a proofing process. In these transfer systems, photosensitive layers containing selected color materials are transferred to a transfer ground paper one by one. Exposure and development are repeated for each color to form a synthetic image. Photosensitive adhesive layers are laminated on the ground paper for each color, and toner is applied after exposure.

However, these transfer systems require repetition of steps of exposure, development and coloring for each color, and also involve complex procedures so as to increase the cost of proofing.

To cope with the above-mentioned problems, Japanese Patent Application No. 57-176758 by the present applicant discloses sensitive materials which may provide original plates of each color separation film and accurate corresponding proofing films at the same time color separation of an original is conducted. According to the invention of the foregoing patent application, the above-mentioned problems in the prior art have been in a particular manner solved.

However, in method of the referenced patent application, at the same time the original plates for each color separation film are made, each image corresponding to that on the original plates is formed. Accordingly it is still required to accurately position the proofing films and the ground paper without slip-off of each color image which transferring each image from the proofing films to the ground paper.

In conventional transfer devices the ground paper and the color materials are laminated with each other, and are manually placed between a pair of heating rollers. In this process, images of the original plates for each color separation film are subjected to exposure after transfer of color materials. Accordingly there has been almost no problems in practical use as to relative positioning of the color materials and the ground paper, and each color material during transferring. However in the prior art laminater, many provisions have disadvantageously occurred such that (1) slip-off between the ground paper and the color materials, and each of color materials is created; (2) wrinkles of colored films and the ground paper are created; and (3) pores are created between the ground paper and the color materials, or each of the color materials.

A further type of conventional transfer device involves a system in which transfer to the ground paper is carried out after exposure and develoment of the proofOing film; in this system, it is stringently required to maintain positioning accuracy upon transferring because images are formed on the proofing films. To meet the requirement, a conventional transfer device includes a pin projecting from one of a pair of drums for rolling the proofreading film and another pin projecting from the other drum for rolling the ground paper. Accordingly, transferring is carried out by heat bonding the film and the paper between the drums.

However, in the foregoing transfer device, it is required to separately roll the ground paper and the proofing film, and, additionally, the rolling operation is troublesome. Further, since the ground paper and the proofing film are rolled on the drums in such a way that they are simply hooked by the pins on the drums, there is a risk of creating wrinkles in the proofing film upon transferring.

Although the above-mentioned problems in the prior art laminater have been solved in various ways and to various degrees, especially in the conventional transfer process, there is still the risk of slip-off between each transferred image, and accordingly the conventional transferring processes are not entirely satisfactory. Further, the creation of wrinkles and pores as mentioned above is a serious problem.

On the other hand, a still further proofing process involving an overlay system, is disclosed in Japanese Patent Laid-Open No. 58-113943, for example. In this overlay system, each film having images from original plates for each color separation film is laminated to the ground paper, or with each other where a ground paper is not used to form a synthetic image. However, in this system, there still exists the above-mentioned problems of slip-off between each film, and creation of wrinkles and pores that interfere with the fidelity of a proof.

SUMMARY OF THE INVENTION

Accordingly, it is an object of the present invention to provide a proofing device which allows a ground paper or each proofing film to be transferred or bonded, with the ground paper on proofing film being accurately and firmly positioned on a table thereby avoiding slip-off of the ground paper and each proofing film.

It is another object of the present invention to provide a proofing device which allows the ground paper or each proofing film to be held in a flat manner on the table and a heating roller to be moved on the paper or the film, thereby avoiding creation of pores and wrinkles between the ground paper and each proofing film.

It is a further object of the present invention to provide a simple proofing device with which conventional proofing processes of a transfer system and an overlay system may be carried out, as well as a new transfer system disclosed in Japanese Patent Application No. 57-176758 by the present applicant.

It is another object of the present invention to provide a proofing device in which proofing work to be carried out on a single table, and in which a simple, rapidly repeatable proofing procedure is performed, so as to attain high speed operation.

It is a still further object of the present invention to provide a proofing device which is simple in structure, thereby reducing cost of production.

According to the present invention, the simple proofing device includes a table for mounting a ground paper or a proofing film thereon. A positioning pin is included and is adapted to protrude into a punch hole formed through the ground paper or the proofing film for positioning the ground paper or the proofreading film on the table. An absorbing groove is provided on an upper surface of the table, and means for applying suction to the absorbing groove are provided for fixedly holding the ground paper or the proofing film on the table by suction. A heating means is mounted on the table in a moveable manner and is effective for heating the proofing film.

The heating means is preferably a rotatable heating roller comprised of a metallic drum incorporating a heater and an elastic member such as silicone rubber covering a circumferential surface of the metallic drum, and adapted to press the proofing film as it rotates. The heating means serves to heat and press the proofing film, and thereby achieves transfer from the proofing film to the ground paper in case of a transfer system, or tight bonding of the proofing film to the ground paper or another proofing film in case of an overlay system. Other heating means may also be used.

The heating means is provided with a temperature control means for maintaining a heating temperature of the proofing film at a constant level and permitting an entire surface of the proofing film to be uniformly heated.

Means are included to elevate or lower the positioning pin relative to the upper surface of the table. The positioning pin is designed to be projected from the upper surface of the table to achieve accurate positioning of the proofing film, while being retractable from the upper surface of the table upon heat treatment by the heating means.

To assist in uniform heating of the proofing film by the heating roller, a heat insulating layer of heat insulating material is preferably provided on the table, or the table itself may be made of heat insulating material. Alternatively, a further heater may be incorporated in the table.

A cover sheet is preferably mounted on the table for attractively fixing the ground paper or the proofing film on the table, and ensuring transfer from the proofing film to the ground paper, or bonding of the proofing film to the ground paper or another proofing film. A means is provided for stretching the cover sheet against the ground paper or the proofreading film before the heating roller is moved on the table.

A noncontact means is preferably mounted at one end of the table for selectively holding the heating means in noncontact condition relative to the upper surface of the table. The noncontact means may be a means for elevating the heating means or a means for lowering the upper surface of the table.

Where the heating means is a heating roller, a first rotary means is mounted at one end of the table, and a second rotary means is provided on a rotary shaft of the heating roller opposite to the first rotary means. The second rotary means receives rotation from the first rotary means, whereby the heating roller is idled by the rotation of the first rotary means when the roller is out of contact with the upper surface of the table. This helps to ensure that the heat distribution of the heating roller uniform.

The invention will be more fully understood from the following detailed description and appended claims when taken with the drawings in which:

DETAILED DESCRIPTION OF THE PREFERRED EMBODIMENTS

Figure 1:
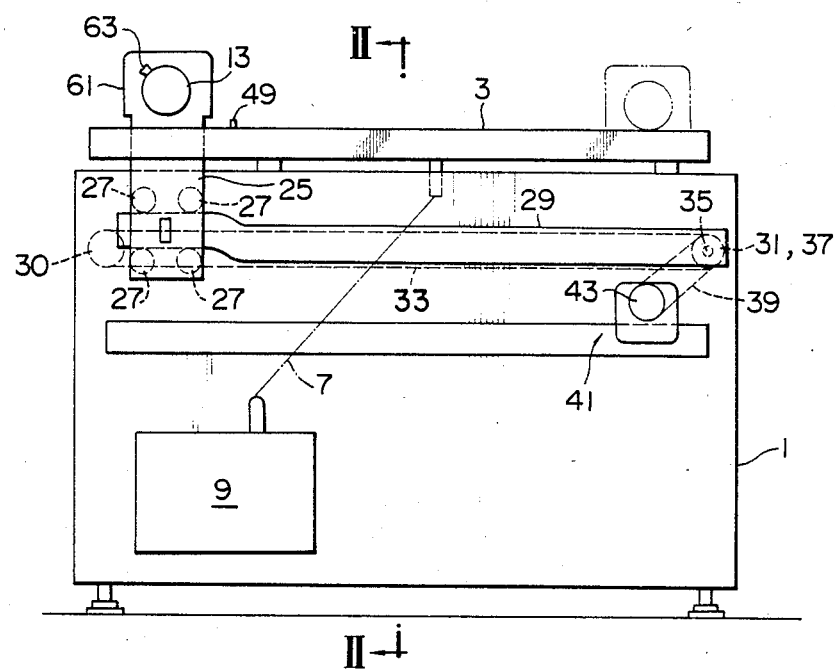
FIG. 1 is a cross-section in elevation of the proofing device according to a first embodiment of the present invention.
Figure 2:
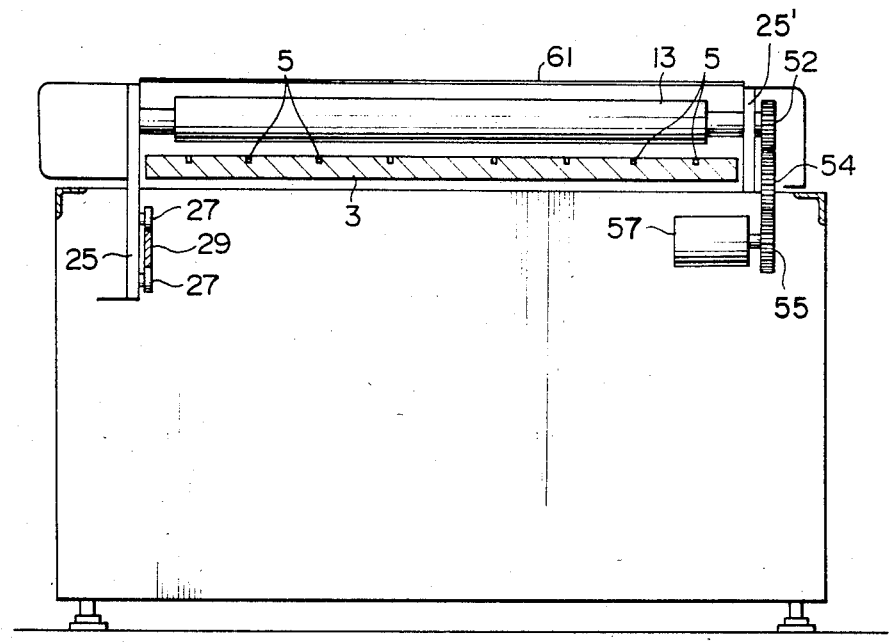
FIG. 2 is a cross-sectional view taken along the line II—II in FIG. 1.
Figure 3:
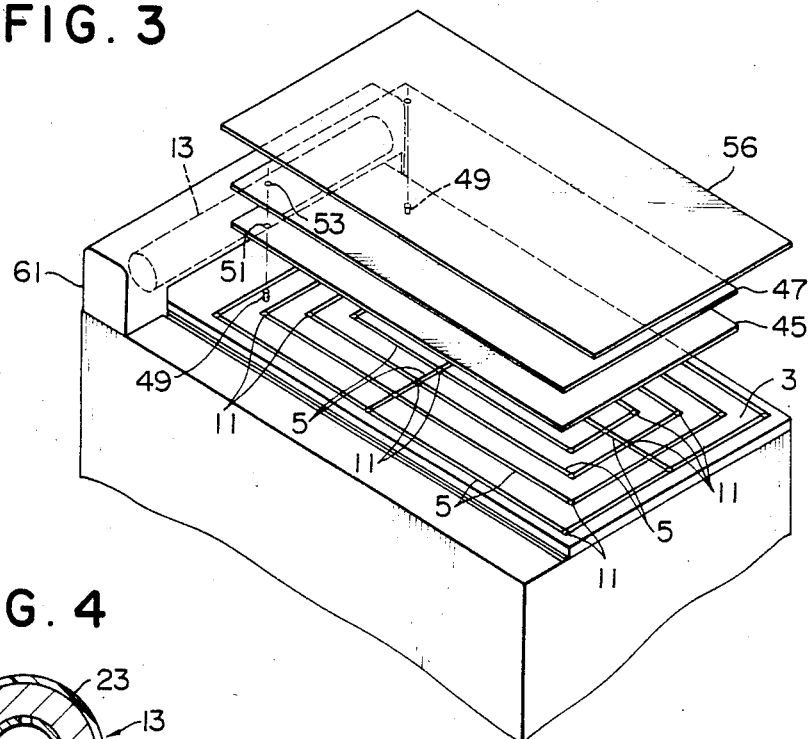
FIG. 3 is a schematic perspective view illustrating the operational procedure of the proofing device of FIG. 1.

Referring now to FIGS. 1, 2 and 3 which schematically illustrate a proofing device according to the present invention, there is formed on an upper surface of a body 1 a table 3 for mounting a ground paper 45 or a proofing film 47 thereon which will be hereinafter described. The table 3 is provided with differently sized absorbing grooves 5 coaxially arranged on an upper surface thereof as best shown in FIG. 3. There are provided through-holes 11 at predetermined positions of the grooves 5 for communicating through a suction hose 7 with a suction device 9.

There is provided a pair of positioning pins 49, which are allowed to be elevated and lowered by an operating handle (not shown), at an end of the table 3. For example, referring to FIG. 3, when the ground paper 45, the proofreading film 47 and a cover sheet 56 are mounted on the table 3, the positioning pins 49 are elevated to be projected from the upper surface of the table 3, and then they are projected into respective punch holes 51 and 53 formed through the ground paper 45 and the proofing film 47, so as to position the paper and film. Further, when images are transferred from the proofreading film 47 to the ground paper 45, the positioning pins 49 are retracted to such a level that the upper end of the pins protrudes not further than the upper surface of the table 3.

Figure 4:
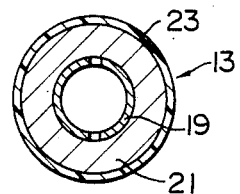
FIG. 4 is a vertical cross-section of the heating roller.

A heating roller 13 is arranged on the table 3, and a rotary shaft of the heating roller 13 is rotatably supported by support plates 25 and 25' at its ends. As shown in FIG. 4, the heating roller 13 is comprised of a metallic drum 21 incorporating a heater 19 and an elastic member 23 such as silicone rubber covering a circumferential surface of the drum 21.

The support plates 25 and 25' are movably supported at their lower portions to a pair of guide rails 29 extending in a lateral direction of the body 1 through two pairs of guide wheels 27. As shown in FIG. 1, the guide rails 29 are curved in such a manner that their left portions are arranged at a slightly higher level than their right portions.

Accordingly, the heating roller 13 is allowed to be moved on the table 3 both laterally due to horizontal movement of the support plates 25, and also vertically due to the curvature of the guide rails 29. The lower level portion of the guide rails 29 corresponds to a position of the heating roller 13 in which the roller is brought into press-contact with the upper surface of the table 3.

Further, at the higher level portion at the left-hand side of the guide rails 29 the heating roller 13 is moved slightly upwardly so as to be held over the upper surface of the table 3 under a noncontact condition.

A driven gear 52 is fixed on the rotary shaft of the heating roller 13 as shown in FIG. 2. An intermediate gear 54 is provided on the table 3. A part of the circumference of the intermediate gear 54 is projected from the upper surface of the table 3. The gear 54 is in constant mesh with a drive gear 55, whichis driven by a motor 57.

The driven gear 52 and the intermediate gear 54 are meshed with each when the heating roller is out of contact with the table 3, as in FIG. 1. In this position, the heating roller 13 rotated by the motor 57 through gears 52, 54 and 52 in an idle condition. Owing to this idle operation of the heating roller 13 in the heat distribution on the circumferential surface of the heating roller 13 becomes uniform.

The movement of the heating roller 13 relative to the table 3 is attained by two driving chains 33 to which the support plates 25 supporting the heating roller 13 are fixedly attached to the chains 33 at predetermined positions by stopper means. The driving chains 33 are respectively associated with the support plates 25 and 25' of FIG. 2. The chains 33 and associated sprockets are preferably symmetrical with each other. Thus, only one of the chains 33 and associated sprockets will be described in detail.

The stopper means will be hereinafter described. The chain 33 is wound about a pair of sprocket wheels 30 and 31 mounted in the body 1. The chain 33 is horizontally stretched between the sprocket wheels 30 and 31. Another sprocket wheel 37 is fixed on a sprocket shaft 35, and it is linked through a further chain 39 to a sprocket wheel 43 fixed on a drive shaft of a motor 41.

Accordingly, the chain 33 is driven in forward and reverse directions by suitably driving the motor 41 in its forward and reverse directions. The support plates 25, which are fixedly attached to the chains 33 at predetermined positions, are moved in the right and left directions as viewed in FIG. 1.

Figure 5:
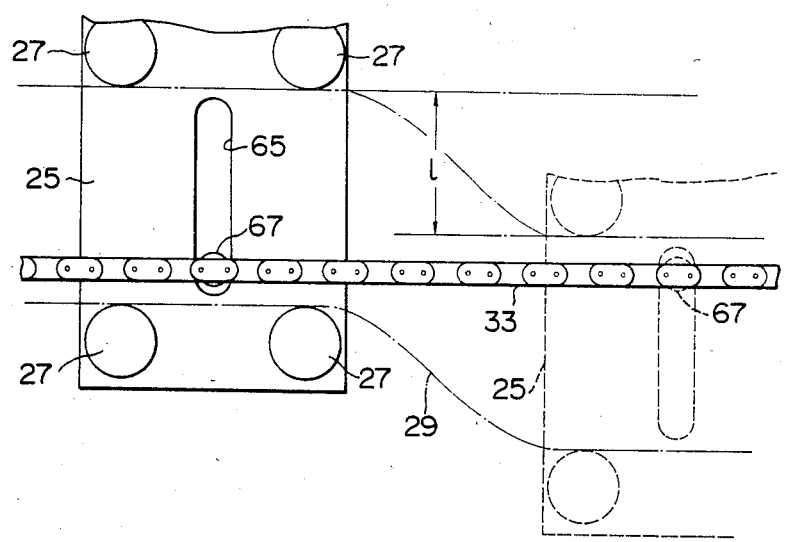
FIG. 5 is a partial view of a stopper means for engaging support plates and chains of the proofing device of FIG. 1.

As shown in FIG. 5, the above-mentioned stopper means is comprised of stopper pins 67 inserted in vertically elongated openings 65 of the support plates 25 and 25' so as to be vertically slideable in the openings. The vertical length of the openings 65 is in coincidence with a length 1 corresponding to the curvature of the guide rails 29, the between the higher level portion and the lower level portion of the guide rails 29. The stopper pins 67 are fixedly attached to the chains 33, so that the support plates 25 may be moved in correspondence with the forward and reverse movement of the chains 33.

The upper surface of the table 3 on which the ground paper 45 and the proofing film 47 are mounted is coated with felt or Teflon material to form a heat insulating layer (not shown). Owing to the heat insulating layer, upon transferring images from the proofing film 47 to the ground paper 45, or upon applying the proofing film 47 onto the ground paper 45 or another proofing film, heat from the heating roller 13 is prevented from being drawn away by the table 3.

There is provided a thermosensor 63 attached on or disposed near the surface of the heating roller 13 in a housing 61 accommodating the heating roller 13. The thermosensor 63 measures a surface temperature of the heating roller 13.

The thermosensor 63 is connected to a temperature control device (not shown) for controlling the heater 19 incorporated in the heating roller 13, so as to maintain the surface of the heating roller 13 at a desired preset temperature.

Although the proofing device of the above embodiment of to the present invention is constituted of the above-mentioned structure, it should be appreciated that the invention is not limited to such a structure as described above.

For example, although the above embodiment shows that a heat insulating layer such as felt or Teflon material is provided on the table 3 to minimize heat sinking into the table, the table 3 itself may be formed of heat insulating materials. Alternatively a heater (not shown) may be incorporated in the table 3.

Figure 6:
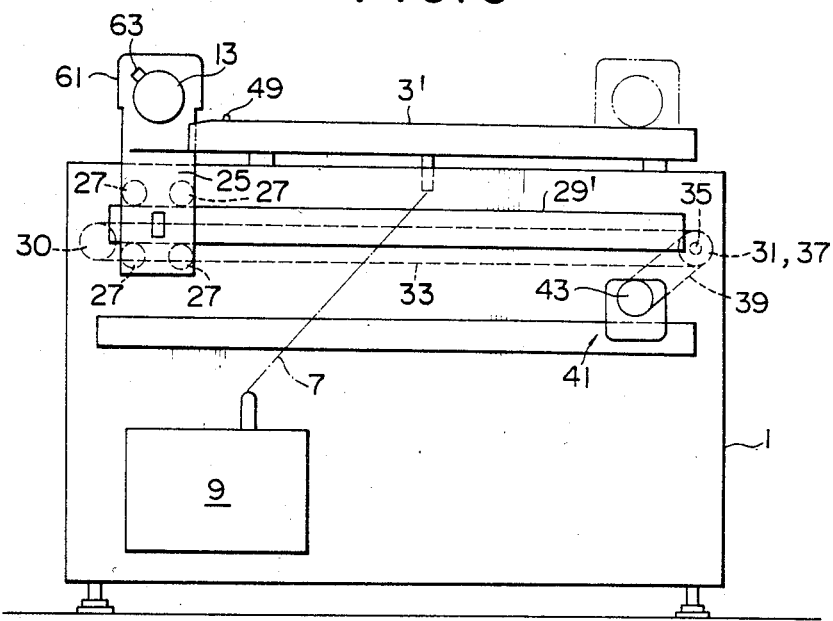
FIG. 6 is a cross-section in elevation of the proofing device according to a further embodiment.

Further, although in the above embodiment the heating roller 13 is held in a noncontact condition relative to the table 3 by providing a slight upward curvature for in the guide rails 29, the guide rails 29' may be linearly extended in the horizontal direction as shown in FIG. 6, and a portion of the table 3' may then be lowered. This permits the heating roller 13 to be maintained under a noncontact condition relative to the table 3.

Moreover, as is described in regard to the previous embodiment, the heating roller 13 is selectively held in a noncontact condition relative to the table 3 and permitted to idle for purposes of uniform heat distribution on the circumferential surface of the heating roller 13. However, where heat distribution on the circumferential surface of the heating roller 13 is uniform to an acceptable degree, the heating roller 13 may be allowed to be disposed at rest in contact with the table 3.

In the afore-mentioned embodiment, as shown in FIG. 3, the cover sheet 56 is laid on the proofing film 47. This allows the ground paper 45 and the proofreading film 47 to be held by vacuum in grooves 5 in a tightly sealed manner. This also allows pressure from the heating roller 13 upon pressing to be uniformly applied on the proofing film.

Figure 7:
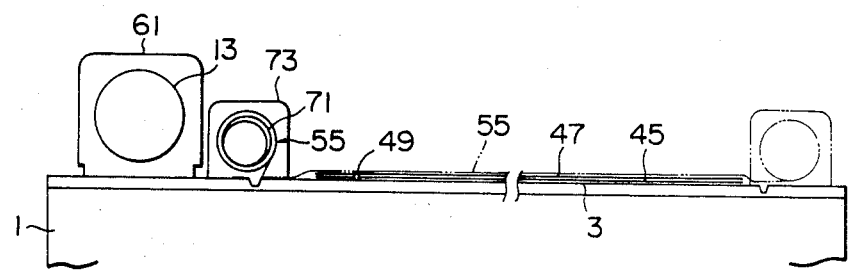
FIG. 7 is a means for stretching a partial view of a cover sheet that may be used in a proofing device according to the present invention.

FIG. 7 illustrates an exemplary stretching device for the cover sheet 56. In the device one end of the cover sheet 56 is fixed to the left end of the table 3, and the other end thereof is fixed to a winding shaft 71 normally biased counterclockwise. When the ground paper 45 and the proofing film 47 are initially positioned on the table 3, the cover sheet 56 is wound into a housing 73 in the left-hand position. After positioning of the ground paper 45 and the proofing film 47, the housing 73 is moved to the right end of the table 3, and as it is moved, the cover sheet 56 unwinds and covers the ground paper 45 and the proofing film 47. The housing 73 is fixed in the right-hand position.

Figure 8:
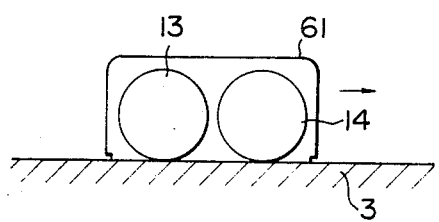
FIG. 8 is a schematic illustration of a heating means of modified embodiment of the invention.

In the above-described embodiments, a single heating roller 13 is employed for pressing and heating, but in another embodiment as shown in FIG. 8, two heating rollers 13 and 14 are incorporated in the housing 61. One heating roller 14 serves as a preheating roller, while the other heating roller 13 serves as a main heating roller. The use of the two rollers 13 and 14 enhance the uniform heating of the proofing film 47 or the ground paper 45.

The operation of the proofing device according to the present invention is now described.

The proofing device as described in the previous embodiment is readily applicable to proofing works of both transfer system and overlay system, but the following description of operation is concerned with a system disclosed in Japanese Patent Application No. 57-176758 by the present applicant. In the system of the foregoing application, images of various colors are sequentially transferred from proofing films prepared together with original plates for color separation films to a ground paper, so as to complete a proofing work.

First, according to the disclosure of Japanese Patent Application No. 57-176758, an original is subjected to color separation with a scanner, etc. to obtain original plates for each color separation film and proofing films of each color. The proofing films are preliminarily formed with a colored layer. After forming latent images corresponding to each color image simultaneously with color separation, the other colored layer at a portion other than the images is removed by washing. By this procedure, there are produced proofing films of each color having colored images accurately corresponding to the original plates for each color separation film.

A heat bonding layer is laid on a bottom surface of the colored layer. (That is, an upper surface when the colored layer is transferred to the ground paper 45.) A top surface of the colored layer (that is, a surface opposite to the ground paper 45) is not provided with a bonding layer because of washing treatment, but a top surface of the ground paper 45 is provided with a heat bonding layer.

Then, punch holes 51 and 53 are opened through the ground paper 45 and the proofing films 47 of each color, respectively. In particular the opening operation of the punch hole 53 through the proofing films 47 should be carefully conducted so that images on the proofing films 47 may be accurately. Therefore, it is desirable to punch out the films by accurately registering a register-mark (not shown) formed simultaneously with color separation of the original.

Next, the punch hole 51 opened through the ground paper 45 is engaged with the positioning pins 49 to position the ground paper 45 on the table 3. Thereafter, the proofing film 47 of a cyan plate is positioned on the ground paper 45 by engaging the punch hole 53 with the positioning pins 49 in the same manner.

After the ground paper 45 and the proofing film 47 of the cyan plate are positioned on the table 3, the cover sheet 56 is laid on the film. Then the suction device 9 is operated to apply suction to the space defined between the table 3 and the cover sheet 56.

Accordingly, the ground paper 45 and the proofing film 47 mounted on the table 3 are held by suction on the table 3 through the absorbing grooves 5. Then, the positioning pins 49 are lowered from the upper surface of the table 3 by the operating handle (not shown).

Next, the heating roller 13 is pressed on the cover sheet 56 and is moved reciprocatively to carry out a heat bonding between the colored layer of the proofing film 47 and the heat bonding layer laid on the top surface of the ground paper 45. In this manner a cyan image is transferred onto the ground paper 45.

At this time, since the heat distribution on the circumferential surface of the heating roller 13 is initially uniform when the heating roller is out of contact with the table 3. uniform transfer of the image from the proofing film 47 to the ground paper 45 may be attained over the entire surface of the paper.

While the heating roller 13 is in an idle condition in a noncontact condition it moves with driven rotation accompanied by press-contact with the cover sheet 56. This is because the mesh of the driven gear 52 with the intermediate gear 54 is released when the heating roller 13 moves into contact with the table 3 (that is, to the right in FIG. 1).

After completion of transfer of the cyan plate in the above manner, the positioning pins 49 are so as to be projected from the table 3 by the operating handle (not shown), and the operation of the suction device 9 is terminated. Then, the cover sheet 56 is removed from the upper surface of the table 3, and the proofing film 47 of the cyan plate, which has been already transferred, is removed from the positioning pins 49.

Thereafter, in a similar manner, yellow, magenta and black plates are transferred to the ground paper 45 in this order to form images.

In the above description of operation concerning four color separation plates, the transferring order of the proofing films is not limited to the above. Further, it should be appreciated that the above procedure is applicable to a special color separation plate.

Further, the proofing device according to the present invention is applicable to conventional proofing processes of a transfer system and an overlay system as well as the above-mentioned proofing process.

While the invention has been described with reference to specific embodiments, the description is illustrative only and is not be construed as limiting the scope of the invention. Various modifications and changes may occur to those skilled in the art without departing from the spirit and scope of the invention as defined by the appended claims.

What is claimed is:

1. A proofing device comprising a table for mounting a ground paper or a proofing film thereon, a positioning pin adapted to protrude into a punch hole formed through a proofing film or a ground paper for positioning the ground paper or the proofing film on said table, an absorbing groove provided on an upper surface of said table, means for applying suction to said absorbing groove for fixedly holding by suction a ground paper or a proofing film on said table, and a heating means to heat a proofing film and being movably mounted on said table.

2. The proofing device as defined in claim 1, wherein said heating means is a rotatable heating roller comprised of a metallic drum incorporating a heater element, an elastic member covering a circumferential surface of said metallic drum, and a rotatable shaft on which said heater element and said elastic member are mounted.

3. The proofing device as defined in claim 1 or 2, further comprising means to elevate or lower said positioning pin relative to the upper surface of said table.

4. The proofing device as defined in claim 1 or 2, further comprising a cover sheet stretching means mounted on said table for a stretching a cover sheet over a top surface of a ground paper or a proofing film.

5. The proofing device as defined in claim 1 or 2, further comprising means mounted at one end of said table for selectively holding said heating means in noncontact condition relative to the upper surface of said table.

6. The proofing device as defined in claim 1, wherein said heating means is a rotatable heating roller comprised of a metallic drum incorporating a heater element, an elastic member covering a circumferential surface of said metallic drum, and a rotatable shaft on which said heater element and elastic member are mounted, and further comprising a first rotary means mounted at one end of said table for rotating said heating roller when said roller is in noncontact condition relative to the upper surface of said table, and a second rotary means provided on said rotary shaft of said heating roller opposite to said first rotary means and adapted to receive rotation from said first rotary means, whereby said heating roller is idled by the rotation of said first rotary means when said roller is out of contact with the upper surface of said table.

7. The proofing device as defined in claim 1 or 2, wherein said heating means is provided with a control means for maintaining a heating temperature of said heating means at a fixed preset temperature.

8. The proofing device as defined in claim 1, further comprising a heat insulating layer of heat insulating material situated on said table.

9. The proofing device as defined in claim 1, wherein said table is made of heat insulating material.

10. The proofing device as defined in claim 8 or 9, wherein said table incorporates a heater.

* * * * *